(12) United States Patent
Hsu et al.

(10) Patent No.: US 7,598,610 B2
(45) Date of Patent: Oct. 6, 2009

(54) PLATE STRUCTURE HAVING CHIP EMBEDDED THEREIN AND THE MANUFACTURING METHOD OF THE SAME

(75) Inventors: Shih-Ping Hsu, Hsinchu (TW); Chung-Cheng Lien, Hsinchu (TW); Kan-Jung Chia, Hsinchu (TW); Shang-Wei Chen, Hsinchu (TW)

(73) Assignee: Phoenix Precision Technology Corporation, Hsinchu (TW)

( * ) Notice: Subject to any disclaimer, the term of this patent is extended or adjusted under 35 U.S.C. 154(b) by 395 days.

(21) Appl. No.: 11/649,295

(22) Filed: Jan. 4, 2007

(65) Prior Publication Data

US 2008/0164597 A1 Jul. 10, 2008

(51) Int. Cl.
*H01L 23/06* (2006.01)
*H01L 23/48* (2006.01)

(52) U.S. Cl. .................. 257/703; 257/778; 257/780; 257/699; 257/E23.182

(58) Field of Classification Search .................. 257/703, 257/778, 780, 699, E23.182, E23.178
See application file for complete search history.

(56) References Cited

U.S. PATENT DOCUMENTS 6,093,970 A * 7/2000 Ohsawa et al. .............. 257/777
6,399,418 B1 * 6/2002 Glenn et al. ................. 438/106
6,506,632 B1 * 1/2003 Cheng et al. ................ 438/126
6,800,941 B2 * 10/2004 Lee et al. .................... 257/773
6,919,508 B2 * 7/2005 Forcier ....................... 174/565
2002/0034651 A1 * 3/2002 Yamagata et al. ........... 428/472
2003/0124767 A1 * 7/2003 Lee et al. .................... 438/107
2003/0227095 A1 * 12/2003 Fujisawa et al. ............ 257/782

* cited by examiner

*Primary Examiner*—Nitin Parekh
(74) *Attorney, Agent, or Firm*—Bacon & Thomas, PLLC

(57) ABSTRACT

A plate structure having a chip embedded therein, comprises an aluminum plate having at least one aluminum oxide layer formed on its surface, and a cavity therein; a chip embedded in the cavity, wherein the chip has an active surface; at least one electrode pad mounted on the active surface; and a build-up structure mounted on the surface of the aluminum plate, the active surface of the chip, and the surface of the electrode pad, wherein the build-up structure comprises at least one conducting to electrically connect to the electrode pad. Besides, a method of manufacturing a plate structure having a chip embedded therein is disclosed. Therefore, the plate structure having a chip embedded therein can be processed by a simple method to achieve the tenacity of aluminum and the rigidity of aluminum oxide.

7 Claims, 4 Drawing Sheets

PLATE STRUCTURE HAVING CHIP EMBEDDED THEREIN AND THE MANUFACTURING METHOD OF THE SAME

BACKGROUND OF THE INVENTION

1. Field of the Invention

The present invention relates to a plate structure embedded with chips and the manufacturing method thereof, and more particularly, to a plate structure embedded with chips and having both ceramic rigidity and metal tenacity by which a drawback of plate warpage resulting from asymmetric build-up process is improved, and the manufacturing method thereof.

2. Description of Related Art

As the electronics industry grows vigorously, the design trend of the electronic products is towards multi-function and high efficiency. In order to satisfy high integration and miniaturization requirements of packaging semiconductor devices, providing circuit boards with the most active or passive components and circuit thereon, is moving gradually from single layer toward multi-layers. As a result, in the limited space of the circuit board, the usable line area is expanded by interlayer connection to fit the requirement of integrated circuits having high layout density.

First, suitable chip package substrates of semiconductor devices are produced through a common manufacture of semiconductor devices. Then, the chip package substrate is processed by chip attachment, molding, bumping etc. for assembling semiconductor devices. Finally, the semiconductor devices having electric performance required by clients are completed. Because the steps of the practical manufacture are minute and complex, interfaces are not integrated easily at the time when manufactured by different manufacturing proprietors. Further, if the client wants to change the design of the function, efficiency and economic benefit suffer.

In the conventional semiconductor device structure, semiconductor chips are attached on top of a substrate, and then processed in wire bonding or connected with a flip chip. Further, solder balls are deposited on the side of the substrate that does not have semiconductor chips attached thereto so as to connect with external electronic elements. Although an objective of high quantity pin counts is achieved, too long pathways of conductive route making electric performance unable to be improved in the more frequent and high-speed operating situations limit this condition. Otherwise, the complexity of the manufacture is relatively increased because too many connective interfaces are required for conventional packages.

In many studies, chips directly conducting to external electronic elements are embedded into package substrate to shorten conductive pathways, decrease signal loss and distortion, and increase abilities of high-speed operation.

In order to prevent laser drilling from damaging the chip in the plate, a metal layer is coated on the surface of the electrode pads on the active surface of the chip according to the plate structure having embedded chips (as shown in FIG. 1). The plate structure having embedded chips comprises: a plate 101 having cavities; chips 102 set in the cavities and plural electrode pads 103 formed on the surface thereof; a protective layer 104 formed on the chip 102 and corresponding to the exposed electrode pads 103; plural metal layers 105 formed on the surface of the electrode pads 103; and a build-up structure 106 formed on the surface of the plate 101 and the chip 102. Further, the build-up structure 106 formed on the surface of the plate 101 and the chip 102 conducts the plate 101 and the electrode pad 103 on the chip 102.

Currently, the common material of the plate 101 among the plate structures having embedded chips is a ceramic or metal. Manufacture of metal plates having simple steps and low costs is useful to produce a large number thereof. However, utilizing metal plates to be the core material of the chip embedded package causes the asymmetric build-up structure 106 leading to warpage of the metal plate because of poor mechanical characteristics of the metal plate. On the other hand, a ceramic material has excellent heating and mechanical characteristics, simple miniaturization of wiring, and high manufacturing accuracy of size. However, manufacturing costs of large size ceramics plates are very high. Therefore, if the plate structure embedded with chips is made of ceramic material, the costs of the plate are accordingly high.

So, as the assembling technology develops, the plate made of only one material does not meet requirements.

SUMMARY OF THE INVENTION

In view of the above conventional shortcomings, the present invention provides a plate structure embedded with chips comprising: an aluminum plate having at least one aluminum oxide layer formed on the surface thereof, and at least one cavity; a chip, of which plural electrode pads are set on an active surface and embedded in the cavity, and a gap between the aluminum oxide plate and the chip is filled with filling material to secure the chip in the cavity of the aluminum oxide plate; and at least one build-up structure set on the surface of the aluminum plate, the active surface of the chip, and the surface of the electrode pads, wherein the build-up structure has at least one conductive structure conducting to and corresponding to the electrode pad.

In other words, in the plate structure embedded with chips of the present invention, the aluminum plate is treated by oxidation to form a metal/ceramics composite plate having at least one aluminum oxide layer (Young's modulus of the aluminum oxide is about 380 Gpa) on the surface. The metal/ceramic composite plate has both the rigidity of ceramics and the tenacity of metal and overcomes the shortfall of the plate warpage resulting from asymmetric build-up process (build-up process only fabricating on one surface of the plate).

In the plate structure embedded with chips in the present invention, material of the aluminum plate can be aluminum or aluminum alloy, but preferably is aluminum alloy.

In the plate structure embedded with chips in the present invention, the way of forming the aluminum oxide on the aluminum plate could be any oxidative method, but preferably is formed by way of anodic oxidation.

In the plate structure embedded with chips in the present invention, aluminum oxide is formed on at least one surface of the aluminum plate, but preferably on both the top and bottom surfaces of the aluminum plate to form an aluminum oxide/aluminum/aluminum oxide tri-layer structure.

In the plate structure embedded with chips in the present invention, the width of the aluminum channels in the aluminum oxide plate is decided in accordance with the electric requirements or the thickness of the plate structure, but is not necessarily limited thereto. The width of the aluminum channels in the aluminum oxide plate is controlled by different oxidation or conditions, but is not necessarily limited thereto.

In the plate structure embedded with chips in the present invention, the material of the electrode pads is preferably aluminum or copper, but is not necessarily limited thereto.

In the plate structure embedded with chips in the present invention, the fixing material is not necessarily limited to, but preferably is epoxy resin, or material of dielectric layers.

In the plate structure embedded with chips in the present invention, the build-up structure comprises a dielectric layer, a circuit layer stacked up on the dielectric layer, and at least one conductive structure which crosses the dielectric layer to provide the circuit layer conducting to another circuit layer or the electrode pad under the dielectric layer.

Material of the build-up structure is not necessarily limited to, but preferably is selected from any one of a group consisting of Ajinomoto Build-up Film (ABF), bismaleimide triazine (BT), benzocyclobutene (BCB), liquid crystal polymer, polyimide (PI), poly(phenylene ether), poly(tetra-fluoroethylene), aramide, epoxy resin, and fiber glass. Material of the circuit layer and the conductive structure is not limited to, but preferably is copper, tin, nickel, chromium, titanium, copper/chromium alloy, or tin/lead alloy.

The plate structure embedded with chips in the present invention further comprises a solder mask layer formed as an insulating protection layer on the surface of the build-up structure. Openings are defined in the solder mask layer to expose the conductive pads on the surface of the build-up structure. Plural solder bumps are set on the openings of the solder mask layer to contact the build-up structure.

A seed layer is formed between the circuit layer and the dielectric layer, or between the conductive layer and the solder bump. The seed layer is mainly a conductive route required for electroplating. Material of the seed layer is selected from any one of a group consisting of copper, tin, nickel, chromium, titanium, copper/chromium alloy, and tin/lead alloy. The seed layer could be also made of a conductive polymer that is selected from any one of a group consisting of polyacetylene, polyaniline, and organic sulfide polymer.

The plate structure embedded with chips in the present invention further comprises plural solder bumps, wherein at least one conductive structure of the build-up structure conducts to the solder bump.

The present invention also provides a manufacturing method for a plate structure embedded with chips, comprising the following steps: (A) providing an aluminum plate; (B) oxidizing the aluminum plate to form an aluminum oxide layer on a surface thereof; (C) forming a cavity in the aluminum plate; (D) embedding and fixing a chip into the cavity of the aluminum oxide plate, wherein the active surface of the chip has plural electrode pads, and a filling material is deposited in a gap between the aluminum oxide plate and the chip to fix the chip in the cavity of the aluminum oxide plate; and (E) forming at least one build-up structure on the surface of the electrode pad, the active surface of the chip, and the aluminum oxide plate, wherein the build-up structure has at least one conductive structure conducting to and corresponding to the electrode pad.

Through the aforementioned way, the plate structure embedded with chips becomes a metal/ceramics composite plate having at least one aluminum oxide layer. The metal/ceramic composite plate has both rigidity of ceramic and tenacity of metal to overcome the shortfall of plate warpage resulting from asymmetric build-up process.

In the manufacturing method of the plate structure embedded with chips in the present invention, material of the aluminum plate can be aluminum or aluminum alloy, but is preferred to be aluminum alloy.

In the manufacturing method of the plate structure embedded with chips in the present invention, oxidative methods of the aluminum plate are not limited to, but preferably is anodic oxidation.

In the manufacturing method of the plate structure embedded with chips in the present invention, aluminum oxide is formed on at least one surface of the aluminum plate, but preferably is formed on the top and bottom surfaces of the aluminum plate to form an aluminum oxide/aluminum/aluminum oxide tri-layer structure.

In the manufacturing method of the plate structure embedded with chips in the present invention, the material of the electrode pads is not limited to, but preferably is aluminum or copper.

In the manufacturing method of the plate structure embedded with chips in the present invention, the fixing material is not limited to, but preferably is epoxy resin, or material of dielectric layers.

In the manufacturing method for the plate structure embedded with chips in the present invention, forming the build-up structure comprises the following steps: forming a dielectric layer, on which plural vias are formed, on the surface of the electrode pad, the active surface of the chip, and the aluminum oxide plate, wherein at least one via of the dielectric layer corresponds to the electrode pad of the chip; forming a resistive layer on the dielectric layer and in the via thereof; forming plural openings of the resistive layer, wherein at least one opening of the resistive layer corresponds to the electrode pad of the chip; electroplating a metal layer on the plural openings of the resistive layer; and removing the resistive layer, wherein the electroplating metal layer comprises at least one circuit layer and a conductive structure.

In the steps of the build-up structure in the present invention, a seed layer is formed before forming a patterned resistive layer, and the seed layer uncovered with the electroplating metal layer is removed after removing the patterned resistive layer. The seed layer is made of any material selected from a group consisting of copper, tin, nickel, chromium, titanium, copper/chromium alloy, and tin/lead alloy, but preferably is copper. The seed layer is formed by one of sputtering, evaporating, electroplating, electroless plating, physical vapor deposition, and chemical vapor deposition. The seed layer could be also made of a conductive polymer that is formed by way of spin coating, ink-jet printing, screen printing, or imprinting. The seed layer is made from any one of a group consisting of polyacetylene, polyaniline, and organic sulfide polymer.

In the steps of the build-up structure in the manufacturing method for the plate structure embedded with chips in the present invention, the material of the dielectric layer is not limited to, but preferably is selected from at least any one of a group consisting of Ajinomoto Build-up Film (ABF), bismaleimide triazine (BT), benzocyclobutene (BCB), liquid crystal polymer, polyimide (PI), poly(phenylene ether), poly (tetra-fluoroethylene), aramide, epoxy resin, and fiber glass.

In the steps of the build-up structure in the manufacturing method for the plate structure embedded with chips in the present invention, the material of the electroplating metal layer is not limited to, but preferably is copper, tin, nickel, chromium, palladium, titanium, tin/lead alloy, or alloy thereof, and more preferably is copper.

Therefore, in the plate structure embedded with chips and the manufacturing method thereof in the present invention, the aluminum plate (metal material) is oxidized to form an aluminum oxide layer (Young's modulus of the aluminum oxide is about 380 Gpa) on at least one surface of the aluminum plate through oxidation, e.g. anodic oxidation. The aluminum oxide layer and the aluminum plate combine firmly together. Consequently, the plate structure embedded with chips in the present invention simultaneously has both rigidity of ceramic and tenacity of metal. In the manufacturing method of the plate structure embedded with chips in the present invention, the aluminum (metal) layer and the aluminum oxide layer (ceramic material) are simultaneously formed on the plate by simple technology without additional steps, e.g. laminating or sintering. Moreover, the price of the aluminum is low and easily manufactured to be useful to produce in large quantities thereof.

Other objects, advantages, and novel features of the invention will become more apparent from the following detailed description when taken in conjunction with the accompanying drawings

DETAILED DESCRIPTION OF THE PREFERRED EMBODIMENT

Embodiment 1

With reference to FIGS. 2a to 2g, there is shown a cross-sectional view of the manufacturing method of the plate structure embedded with chips in one embodiment of the present invention.

Figure 1:
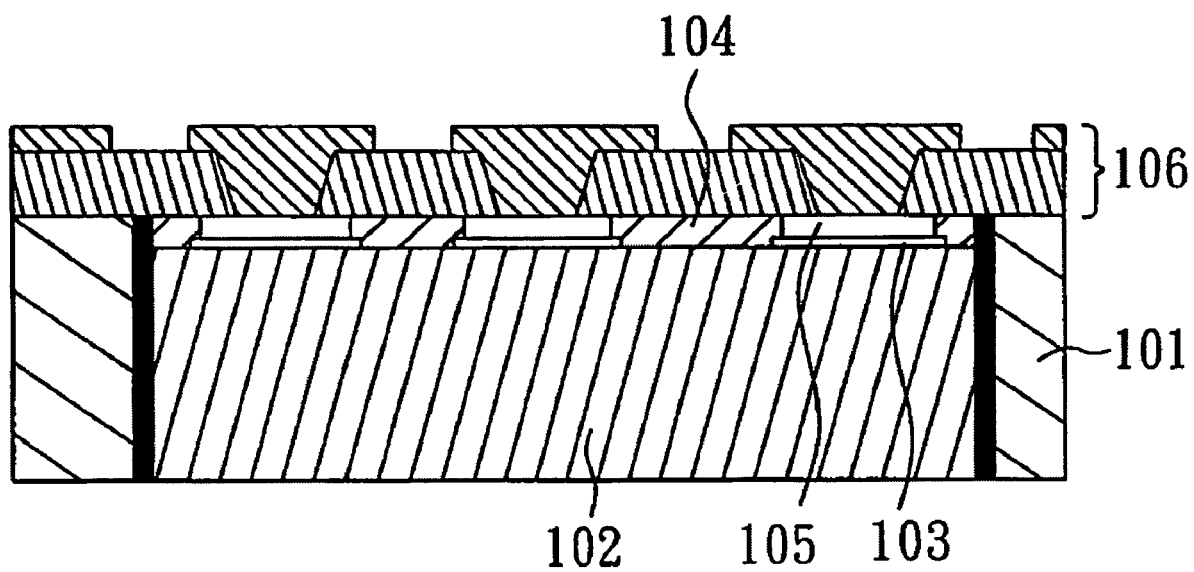
FIG. 1 is a cross-sectional view of a conductive structure of a conventional plate structure embedded with chips.
Figure 2:
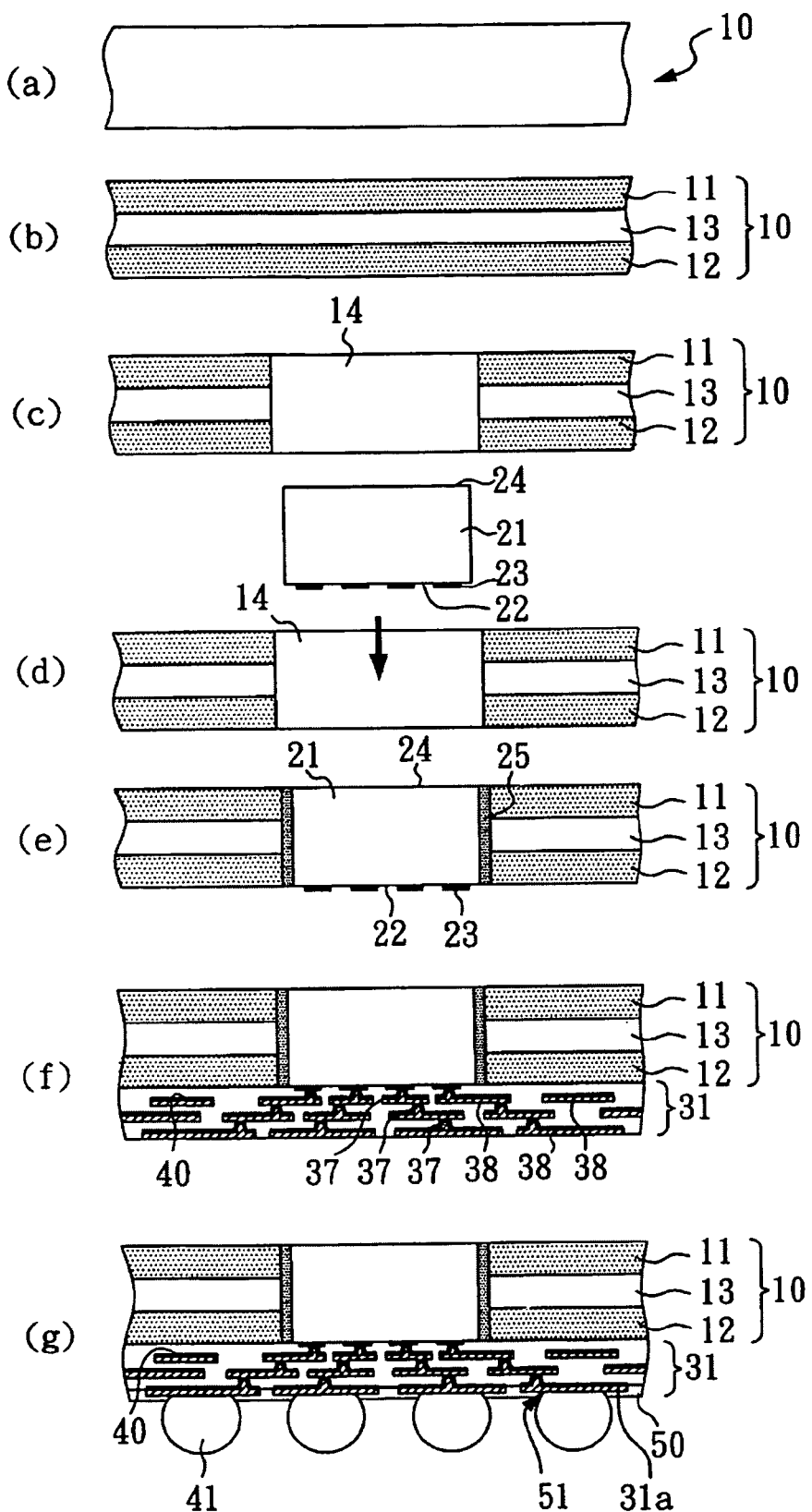
FIGS. 2a to 2g are cross-sectional view of the manufacturing method of the plate structure embedded with chips in one embodiment of the present invention.

As shown in FIG. 2a, an aluminum plate 10 (Young's modulus is 70 Gpa) is first provided. The aluminum plate 10 is put into an electrolytic tank for oxidization. The top surface and bottom surfaces of the aluminum plate 10 are gradually oxidized to be aluminum oxide layers 11 and 12 respectively. An aluminum layer 13 exists between the aluminum oxide layer 11 and 12, as the structure shown in FIG. 2b. In the present embodiment, the aluminum plate 10 is put into an electrolytic tank filled with a solution of oxalic acid or sulfuric acid for anodic oxidation. Through controlling the time of anodic oxidation, the width of the aluminum oxide layers 11 and 12 is decided. After oxidation, Young's modulus of the aluminum plate in the rigidity test reaches up to 400 Gpa. In the present embodiment, the aluminum (metal) layer and the aluminum oxide layer (ceramic material) are simultaneously formed on the plate without additional steps, e.g. molding or sintering. Moreover, the aluminum oxide layer and the aluminum plate combine firmly together. In the present embodiment, the aluminum plate simultaneously has metal tenacity and ceramic rigidity.

Subsequently, as shown in FIG. 2c, a cavity 14 is formed by a router cutting the aluminum plate 10. Then, as in FIG. 2d, a chip 21, which is completed by a wafer integrated circuit process and die sawing, is embedded into the cavity 14 of the aluminum plate 10, and has plural electrode pads 23 made of copper attached on an active surface 22 thereof. Subsequently, epoxy resin 25 is deposited into gaps between the aluminum plate 10 and the chip 21 to fix the chip 21 in the cavity 14 of the aluminum plate 10, as per the structure shown in FIG. 2e. In the present embodiment, the exposed passive surface 24 of the chip 21 is advantageous in providing good cooling.

Figure 3:
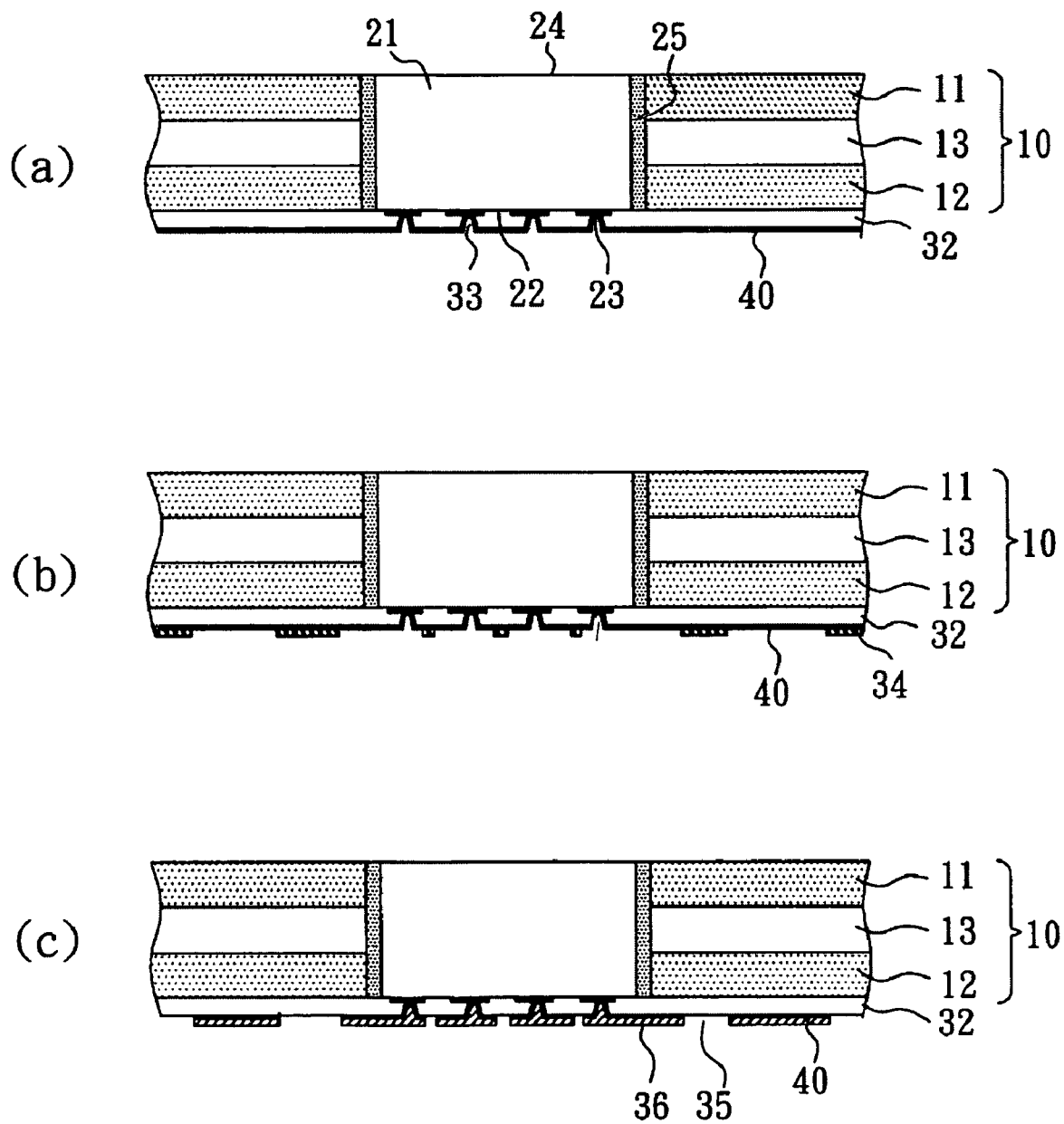
FIGS. 3a to 3c are cross-sectional view of the manufacturing method of the build-up structure in one embodiment of the present invention.

After the aforesaid steps, a build-up structure 31 is formed on the surface of the aluminum plate 10, the active surface 22 of the chip 21, and the surface of the electrode pads 23, as shown in FIG. 2f. The method for forming the build-up structure is shown from FIG. 3a to FIG. 3c. First, a dielectric layer 32 is formed on the surface of the aluminum plate 10, the active surface 22 of the chip 21, and the surface of the electrode pads 23. Material of the dielectric layer 32 is selected from any one of a group consisting of Ajinomoto Build-up Film (ABF), bismaleimide triazine (BT), benzocyclobutene (BCB), liquid crystal polymer, polyimide (PI), poly(phenylene ether), poly(tetra-fluoroethylene), aramide, epoxy resin, and fiber glass. Plural vias 33 are formed on the dielectric layer 32 through laser drilling, or exposing and developing, and at least one corresponds to the electrode pad 23 of the chip 21, as per the structure shown in FIG. 3a. If utilizing laser drilling, a de-smearing step is employed to remove any residual smear due to drilling in via of the dielectric layer. Then, a seed layer 40 is formed on the dielectric layer 32 and in via 33 of the dielectric layer. Further, a resistive layer 34 is formed on the surface of the seed layer 40. Subsequently, plural openings 35 are formed through exposing and developing the resistive layer 34, and at least one corresponds to the electrode pad 23 of the chip 21, as in the structure of FIG. 3b. Finally, as shown in FIG. 3c, electroplating metal layers 36 are plated in the plural openings 35 of the resistive layer. The resistive layer 34 and the seed layer 40 covered by the resistive layer 34 are removed. The build-up structure 31 shown in FIG. 2g is a multilayer structure, and the quantity of stacked layers on the build-up structure requires is achieved by way of build-up technology. The electroplating metal layer 36 includes a circuit layer 37 and a conductive structure 38 conducting to the electrode pad 23 of the chip 21.

Finally, as shown in FIG. 2g, a solder mask layer 50 functioning as an insulating protection layer is formed on the surface of the build-up structure 31. An opening 51 is formed on the solder mask layer 50 to expose the electrode pad 31a on the surface of the build-up structure 31. Plural solder bumps 41 are set in the openings 51 of the solder mask layer 50, and conduct to the build-up structure 31. The plate structure having the chip embedded therein in the present embodiment is completed.

Embodiment 2

The method for manufacturing a plate structure embedded with chips in the present embodiment is very similar to the embodiment 1. Except for the step of fixing the chip and the aluminum being different from embodiment 1, all other aspects are approximately the same as those of the embodiment 1.

Figure 4:
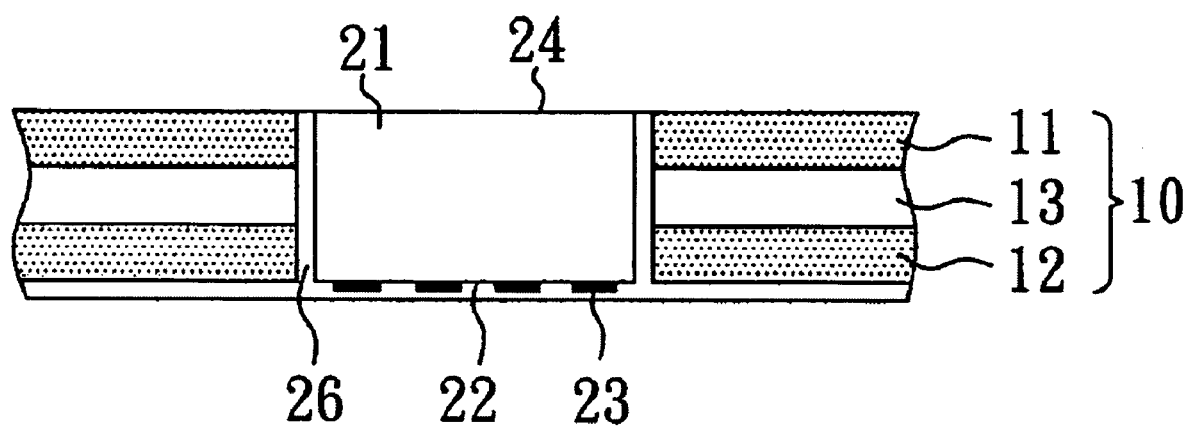
FIG. 4 is a cross-sectional view of the manufacturing method in another embodiment of the present invention.

As shown in FIG. 4, after the chip 21 is embedded into the cavity of the aluminum plate 10, a dielectric material layer 26 is coated on the surface of the aluminum plate 10, and fills the space between the chip 21 and the aluminum plate 10 through molding to fix the chip 21 in the cavity of the aluminum plate 10. The material dielectric layer 26 on the second surface of the aluminum plate 10 is seen as one of the dielectric layers of the build-up structure. Then, the steps of forming the build-up structure continue for the processing of the device. Finally, plural solder bumps are formed on the build-up structure. The plate structure embedded with chips in the present embodiment is completed.

Although the present invention has been explained in relation to its preferred embodiment, it is to be understood that many other possible modifications and variations can be made without departing from the scope of the invention as hereinafter claimed.

What is claimed is:
1. A plate structure embedded with chips comprising:
an aluminum plate, of which an aluminum oxide layers are formed on a top and a bottom surface respectively, having a through hole cavity, a chip with an active surface, of which plural electrode pads are set on an active surface, and a gap between the aluminum plate and the chip is filled with a filling material to secure the chip in the cavity of the aluminum plate, and at least one build-up structure set on the bottom surface of the aluminum plate, the active surface of the chip, and the surface of the electrode pads, wherein the build-up structure has at least one conductive structure electrically conducting to and corresponding to one of the electrode pads.

2. The plate structure embedded with chips as claimed in claim 1, wherein the aluminum oxide layers are formed by way of anodic oxidation.

3. The plate structure embedded with chips as claimed in claim 1, wherein the electrode pads are aluminum or copper pads.

4. The plate structure embedded with chips as claimed in claim 1, wherein the filling material is an epoxy resin.

5. The plate structure embedded with chips as claimed in claim 1, wherein the filling material is a dielectric material.

6. The plate structure embedded with chips as claimed in claim 1, wherein the build-up structure comprises a dielectric layer, a circuit layer set on the dielectric layer, and at least one conductive structure which crosses the dielectric layer to provide the circuit layer electrically conducting to the circuit layer or the electrode pads.

7. The plate structure embedded with chips as claimed in claim 1, wherein a solder mask layer having openings, on which the solder bump is formed on a surface of the build-up structure.

* * * * *